United States Patent
Honma

(10) Patent No.: US 6,249,553 B1
(45) Date of Patent: Jun. 19, 2001

(54) DEVICE AND METHOD FOR DETECTING INFORMATION

(75) Inventor: Hiromi Honma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/989,889

(22) Filed: Dec. 12, 1997

(30) Foreign Application Priority Data

Dec. 12, 1996 (JP) .................................................... 8-331707

(51) Int. Cl.$^7$ ........................................................ H03D 1/00
(52) U.S. Cl. .......................................................... 375/341
(58) Field of Search .................................. 375/229, 341, 375/340, 262, 324; 714/794, 795, 796

(56) References Cited

U.S. PATENT DOCUMENTS

| 4,847,871 | * | 7/1989 | Matsushita et al. | .................... | 375/94 |
| 5,710,792 | * | 1/1998 | Fukawa et al. | ...................... | 375/229 |
| 5,784,415 | * | 7/1998 | Chavillat et al. | .................... | 375/341 |

FOREIGN PATENT DOCUMENTS

| 6-243598 | 9/1994 | (JP) . |
| 6-325504 | 11/1994 | (JP) . |
| 7-45009 | 2/1995 | (JP) . |
| 7-262694 | 10/1995 | (JP) . |

OTHER PUBLICATIONS

G. D. Forney, Jr., "Burst–Correcting Codes for the Classic Bursty Channel", EIII Transactions on Communications Technology, vol. COM–19, No. 5, Oct. 1971, p. 772.

A.J. Viterbi, "Convolutional Codes and Their Performance in Communication Systems", IEEE Transactions on Communications Technology, vol. COM–19, No. 5, Oct. 1971, pp. 751–771.

* cited by examiner

*Primary Examiner*—Chi Pham
*Assistant Examiner*—Kevin M Burd
(74) *Attorney, Agent, or Firm*—Ostrolenk, Faber, Gerb & Soffen, LLP

(57) ABSTRACT

In a direct current fluctuation level detecting circuit, differences between sample values and a Viterbi detector reference level are summed in an interval of n samples using path selection information and minimum path metric information, which are detected in a Viterbi detector, and the function is completed through further operations in a branch difference generating circuit and an AS circuit. A direct current level $V_0$ can be detected by a further process where an AS circuit output is multiplied by 1/n in a multiplier and the multiplication result is stored in a register. A timing generating circuit controls latching of the register and clearing of a path difference value with a cycle of n samples. A detected direct current level $V_0$ is fed back to an input to compensate a direct current level fluctuation in an adaptive manner.

9 Claims, 22 Drawing Sheets

DEVICE AND METHOD FOR DETECTING INFORMATION

BACKGROUND OF THE INVENTION

1. Field of the Invention

The present invention relates to a device for detecting information in which information recorded on a recording medium at a high density can be detected with no error.

2. Description of the Related Art

Research and development on disk units with high densities and large capacities such as optical and magnetic disks represented by DVDs is widely and energetically being pursued. Signal processing technology supporting high reliability in regenerated information is indispensable for such disk units with the higher density features. To this end, filing devices using PRML (Partial Response Maximum Likelihood) technology have successfully entered the market. This system, in which equalization of a partial response wave form and maximum likelihood detection are combined, is well known by conducting the maximum likelihood retrieval after correcting readout signals by wave form equalization in order to utilize characteristics of a maximum likelihood detector giving full consideration to a regenerative channel. For example, there is a description on PRML in the preliminary paper volume for the 1994 annual convention of the Institute of Television Engineers (ITE '94, pp. 287 to 288).

Intersymbol interference grows larger and regenerative amplitude is reduced in the case where information recorded with a high density is regenerated in either an optical disk or a magnetic disk. Therefore, the SNR of a magnetic disk is smaller and the CNR of the high frequency component of a readout signal in the case of an optical disk is also smaller, so that the error rate of detected information is increased. The maximum likelihood detection system detects information by using characteristics of a regenerative channel having a given state transition and if one time series pattern is screened so as to have the minimum square mean of errors among all the time series patterns to be conceivable from the characteristics of the regenerative channel with respect to an amplitude information string having the number of quantized bits, for example, on the order of four bits, which is input to the detector, information can be detected with a low error rate, even though the SNR or CNR is small. It is difficult, however, to perform the above mentioned processing in an actual circuit in terms of the circuit scale and its processing speed, and thus an algorithm called a Viterbi algorithm is used to select a path in a recursive manner in order to realize the process, wherein the Viterbi algorithm is described in IEEE Transactions on Communications, vol. COM-19, October 1971.

An operation in the case where information recorded in an optical disk medium is detected by being subjected to PRML detection using the most simple PR (1, 1) channel is described with reference to FIGS. 21, 22, and 23. A signal read by a head is corrected in advance so as to be the PR (1, 1) channel by use of an equalizer, for example a transversal filter. As shown in FIG. 21, this channel is distributed around three reference levels E1 (=−1, 0, 1). In this case, amplitude information $X_i$ which is digitized in each channel clock is subjected to a two state transition as shown in FIG. 20. A maximum likelihood detection finds a string Ei with which a sum of square errors $z_n$ relative to a reference level shown in the mathematical formula 1 is the minimum with respect to $x_i$.

$$Zn = \sum_{i}^{n} (X_i - E_i)^2 \quad (1)$$

However, it is hard in an actual time span to obtain Ei with which $z_n$ is the minimum by calculating the equation (1) in every case conceivable. Thus, Ei is generally determined using a procedure called a Viterbi algorithm. A graph shown in FIG. 23, which is obtained by redrawing the state transition diagram of FIG. 22 on an abscissa of time, is called a trellis diagram. In a Viterbi algorithm, $z_n$ values of two paths are calculated from respective sums till a time n−1 and $x_n$ input at a time point n and then the path which has the smaller value of $z_n$ is selected, wherein the term "path" means a directive graph in which a time point and the next time point are connected by a line. As time is retroacted from the present to the past, while this path selection is repeatedly conducted at each time point, paths are converged at a time point expressed by an expression indicating that the paths have been merged. This means that it has been determined that a single path is left and the output corresponding to the path is the detection result. Generally, the $z_n$ is called a path metric, and the path metric at a time point is called a branch metric.

$$M_n(S_0) = \min [M_{n-1}(S_0) + (X_n+1)^2, M_{n-1}(S_1) + X_n^2]$$

$$M_n(S_1) = \min [M_{n-1}(S_1) + (X_n-1)^2, M_{n-1}(S_0) + X_n^2] \quad (2)$$

The mathematical formula (2) is a recurrence formula in the case where the above mentioned algorithm is adapted to the state transition of FIG. 22. Mn $(S_j)$ indicates a sum $z_n$ of square errors until a time point n in a state $S_j$ at the time point n and min [a, b] is a function indicating the minimum between a and b. Path metric values for two respective paths at an immediately preceding time point when inputs are respectively made to states $S_0$ and $S_1$ are calculated, whereupon the smaller one is selected and thereafter the path metric value is renewed. FIG. 23 illustrates an example in which selection of a path is conducted at each time point using the mathematical formula (2). A thick line indicates a path conceivable at a time point. Two paths, respectively thick and thin, are present between time points 0 to 6 and there is no determined path, but a merged path is present at time points of 7 and 9. After merging, an output value $q_j$ corresponding to the path is successfully output and thereby the most likelihood detection can be performed.

In order to actually constitute a circuit, $(y_n+1)^2$, $y_n^2$ and $(y_n-1)^2$ are generated in a branch metric calculating circuit 21, such as shown in FIG. 4. Subsequently, path metric values Mn $(S_0)$ and Mn $(S_1)$, and the branch metric value are added, a comparative calculation is conducted and thereby one of the paths input to a state is selected and further the path metric value of the path is used as the new path metric value. This operation is repeated and thereby paths are merged into a single path to detect the most likely path. A comparator output indicating selection information of a path is stored in a path memory 23 and detection of information can be conducted by outputting bit information corresponding to a determined path before a merging point.

In a rewritable optical disk device in its first generation, a mark position recording system is adopted, wherein data is recorded on a disk medium by being converted to a length between pits and information is detected by a peak detection system. In peak detection, a readout signal is differentiated and subjected to zero-cross and thereby the middle position of a recording pit is detected, so that a level fluctuation has never been problematic. When a high density in recording is used, a regeneration amplitude is reduced in the mark position recording system and thereby information cannot be detected with high reliability. For this reason, the mark edge recording system as used in CDS, in which a length of a pit itself bears information, has begun to be used in optical disks. However, when information recorded in this recording system is regenerated, since a peak detecting system cannot be used, a level detection is generally used in which 0 and 1 is decided with a threshold value as a reference. In this case, level fluctuation directly gives a wrong influence and it can be said that this level fluctuation is one of the significant causes for disturbing the process of achieving a higher density.

Especially in the case of an optical disk, a direct current level included in regenerated information has a chance to fluctuate.

(1) There is a possibility, when a polycarbonate substrate is used, that noise up to the order of 10 kHz is mixed into the regenerated information by the influence of birefringence.

(2) In a code file which is subjected to sector segmentation, random access is made possible by providing a preformat region in a leading part of a sector, but this preformat information has a large direct current component and thereby data following the preformat is affected.

(3) A RLL (Run length limited) code adopted as a modulation code is subjected to level fluctuation depending on the record pattern, since the code is not DC free.

In a similar manner to the level detection system, when Viterbi detection is conducted, a direct current level fluctuation causes great degradation in performance as well. In general, while a Viterbi detector has a circuit constitution corresponding to a fixed regenerative channel because of a scale down of the circuit, channel characteristics expected in the Viterbi detector are not realized, since the information string input to the Viterbi detector is added with an offset by a direct current level fluctuation. The reason why is that the addition of the offset is equivalent to superposition of noise on a regenerated information and thereby the reliability in detection is degraded by a great margin.

Conventionally, there have been proposed many techniques to avoid degradation in a performance of Viterbi detection caused by direct current fluctuation. For example, in a system disclosed in Publication of Unexamined Japanese Patent Application No. Hei 6-325504, degradation in performance of Viterbi decoder by a direct current fluctuation is sought to be prevented. FIG. 1 shows a conventional technique described in the publication. There is described that, in an optical disk device in which it is made a precondition that Viterbi detection is conducted under application of a class 1 partial response, a transition pattern, which is changeable when a signal level of a regenerative signal traverses a center level, is detected and the center level is corrected using a sample data in the pattern, so that even when a direct current level is fluctuated, the regenerative signal can correctly be decoded.

Another system shown in Publication of Unexamined Japanese Patent Application No. Hei-7-45009, aims to solve its poor convergence property in a common adaptive control of a level fluctuation. FIG. 2 shows a conventional technique described in the publication. The system comprises a pattern generating means 90 in which transmitted data is divided into block units and a test pattern is added at the leading part of each block, and a switching means 80 in which transmission is conducted by switching pattern data to transmitted data, wherein a known test pattern is added at the leading part of each block and transmitted or recorded. In an operation of regeneration, a direct current component of a transmitted signal is calculated by a predictive control from a transmitted signal of a test data portion taken out by switching means 70 for switching between test data and actual data. There is described a technique that this direct current component is added to a reference predictive amplitude value of a Viterbi decoder 50 to obtain an initial predictive amplitude value and further a small level fluctuation is compensated by predictive control means 60 which controls in a predictive manner.

In a system shown in Publication of Unexamined Japanese Patent Application No. Hei 7-262694, as well, it is an object to prevent degradation in performance of a Viterbi decoder caused by a direct current level fluctuation. FIG. 3 is a conventional technique disclosed in the publication. There is described a technique in which a predetermined sample value in a sample value string is extracted by data discriminating means 16 and sample extracting means 13 using a data amplitude value q after A/D conversion of a readout signal and averaged to detect an offset level. Further, the offset level is uniformly added to each of the predictive sample value in the Viterbi decoder 20, so that a direct current level fluctuation is compensated in an adaptive manner.

A first problem in the conventional technique disclosed in Publication of Unexamined Japanese Patent Application No. Hei 6-325504 is that the technique cannot be applied to other channels, since it only refers to a class 1 partial response. For example, when it is applied to the case where high density recording is conducted, there is presented a simulation result in which a PR (1, 2, 2, 1) channel can detect information with higher accuracy than a PR (1,1) channel can, because of reduction in resolution, as reported in the preliminary paper volume of the Institute of Electronics, Information and Communication Engineers, C-469. A second problem is that the technique detects amplitude information only from transition patterns traversing a center level and for this reason, a SNR of a detected direct current level is low. Since a direct current value must be added to all input information, accuracy is reduced, compared with the case where all information is utilized to detect the direct current level value. A problem with the conventional technique disclosed in Publication of Unexamined Japanese Patent Application No. Hei 7-45009 is that format efficiency is reduced, since there is a necessity that a special pattern is recorded at the leading part of each block. A problem with the conventional technique disclosed in the publication is that the SNR level of a detected direct current level is low, as in the case of the publication of Unexamined Japanese Patent Application No. Hei 6-325504, since only special sample values are extracted and averaged.

SUMMARY OF THE INVENTION

Accordingly, it is an object of the present invention to provide a device for detecting information in which a direct current level fluctuation can be compensated without embedding a special test pattern in data only by modifying a circuit suitable for the channel in a Viterbi detecting device which is adapted to any channel.

It is another object of the present invention to detect information with no error against a direct current level fluctuation appearing immediately after transition from a preformat region to a user region.

A device for detecting information according to the present invention comprises: a subtracter for subtracting an offset from a digitized input sample value; a Viterbi detector using an output of the subtracter as an input; and a detecting circuit for detecting a direct current level from the sample value and path selection information and minimum path metric information which are detected in the Viterbi detector, wherein an output of the direct current level detecting circuit is fed back to the subtracter as an offset value. The direct current level detecting circuit comprises: a branch difference calculation circuit for detecting a difference between an input signal and a reference level; an Add-Select ("AS") circuit for calculating a path difference by summing branch differences of selected paths in n sample terms using path selection information and minimum path metric information from the Viterbi detector; a multiplier for transforming the path difference value to 1/n thereof; a register for holding the multiplication result; and a timing generating circuit for generating a latch signal for the register and a clear signal for a register in the AS circuit with an n sample cycle.

An operation in the above constitution is described as follows.

When a simple sum of simple differences between a digitized, readout signal amplitude information $x_i$ (sample value) and a reference level Ei is indicated by $w_n$, $w_n$ is expressed by a mathematical formula (3).

$$W_n = \sum_{i}^{n} (X_i - E_i) \quad (3)$$

As seen from the formula, $w_n$ is similar to a branch metric in Viterbi detection and, as described later, $w_n$ can be generated in a similar circuit to the Add-Compare-Select ("ACS") circuit in Viterbi detection.

$W_n$ is called a path difference in a corresponding manner to a path metric calculated in a Viterbi detector. The $W_n$ can be calculated if a path is determined. $X_i$ includes a random noise $\delta_i$ in addition to a direct current level V0 and thereby is expressed by a mathematical formula (4).

$$x_i = E_i + V_0 + \delta_i \quad (4)$$

Accordingly, $w_n$ can further be expressed by a mathematical formula (5) from the formulae (3) and (4) if it is considered that an average of random noises is 0 and $V_0$ is constant in an nth sample term.

$$W_n = n \cdot V_0 \quad (5)$$

Therefore, the direct current fluctuation level $V_0$ can be calculated by dividing the path difference sum by n, while the value of n is determined so that the influence of noises is small. If detection information of a Viterbi detector is used, however, in order to detect $E_i$, a delay as large as tens of hundreds of channel clocks is resulted by the influence of a long path memory. For this reason, there arises a fear of degraded tracing performance. In consideration of such circumstances, this problem has been solved by a technique in which path selection information and a minimum path information used in the Viterbi detector are effectively utilized and a calculation is performed in a sequential manner. That is to say, a path difference value is individually calculated for each state of a channel covering all the number of channel states, and a branch difference value is selectively added to a path difference value using path selection information obtained from the Viterbi detector. Thereby, a direct current fluctuation level $V_0$ can be obtained in a comparatively fast and seemingly sure manner. A calculation of the direct current fluctuation level $V_0$ can be performed not only in a recursive manner but in a simple circuit constitution by calculating a path difference value by an AS circuit in the same form as the ACS circuit constitution of the Viterbi detector. However, there are requirements for mechanisms for holding a path difference register value every n channel clocks and for resetting.

In a system which conducts sector management of a recording region in which random accesses are frequently conducted, a direct current level fluctuation arises immediately after a switch from a preformat region to a user data region is conducted. When a compensation of a direct current level is conducted in the above mentioned system, since a delay occurs until the direct current level is detected, there is a possibility that a direct current level immediately after the switching-over to the user data region cannot be determined and thereby an error in reading arises, but it can simply be avoided, if a point where an offset level is rapidly changed is detected, and a circuit for generating change timing information and a register, in which a presetting of a predetermined offset value can be made immediately after a change-over to the user data region is conducted, are used.

DETAILED DESCRIPTION OF THE PREFERRED EMBODIMENTS

Detailed description of the first embodiment of the present invention will be given with reference to the accompanying drawings.

Figure 1:
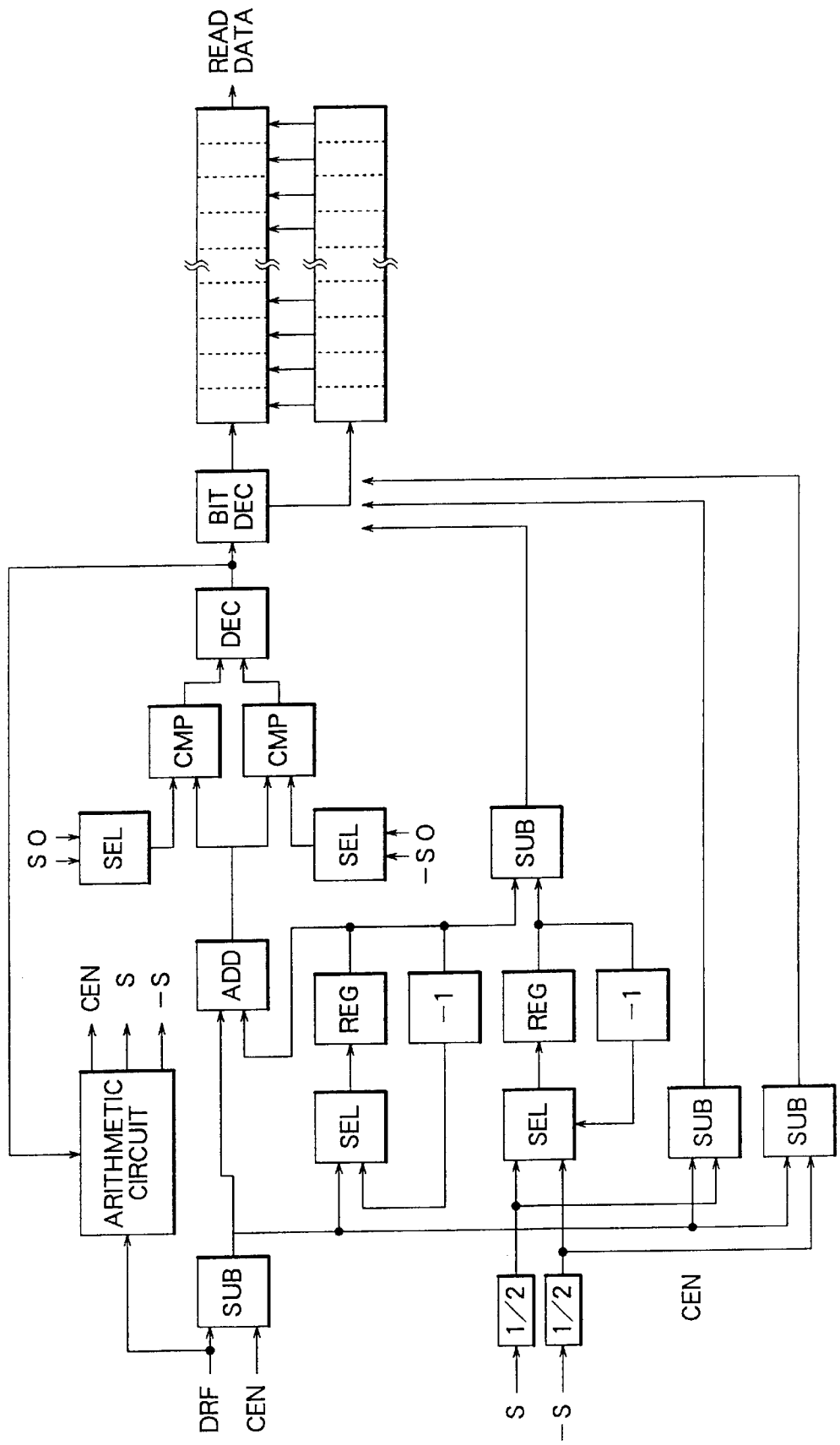
FIG. 1 is a block diagram showing a conventional device.
Figure 2:
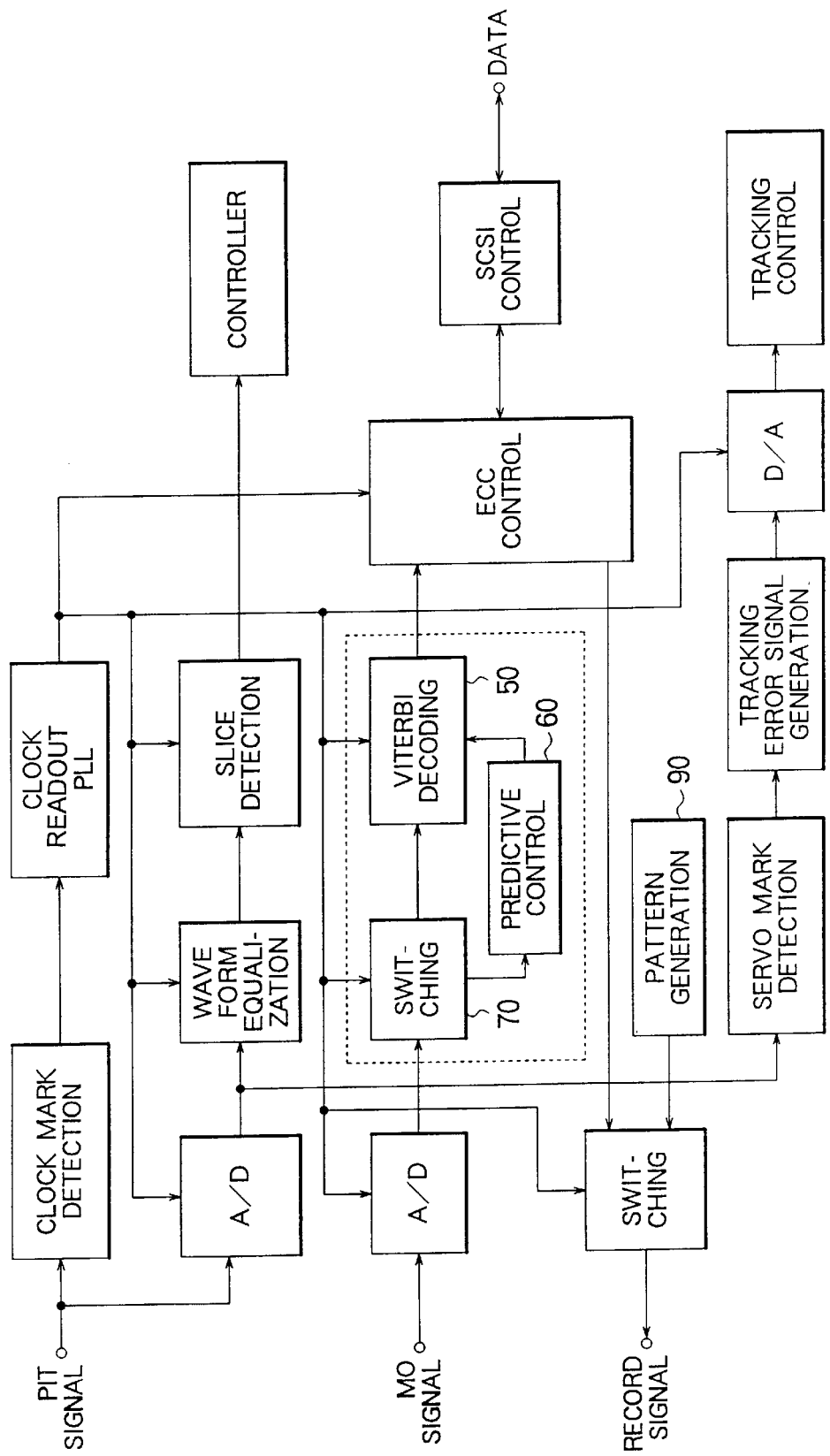
FIG. 2 is a block diagram showing a conventional device.
Figure 3:
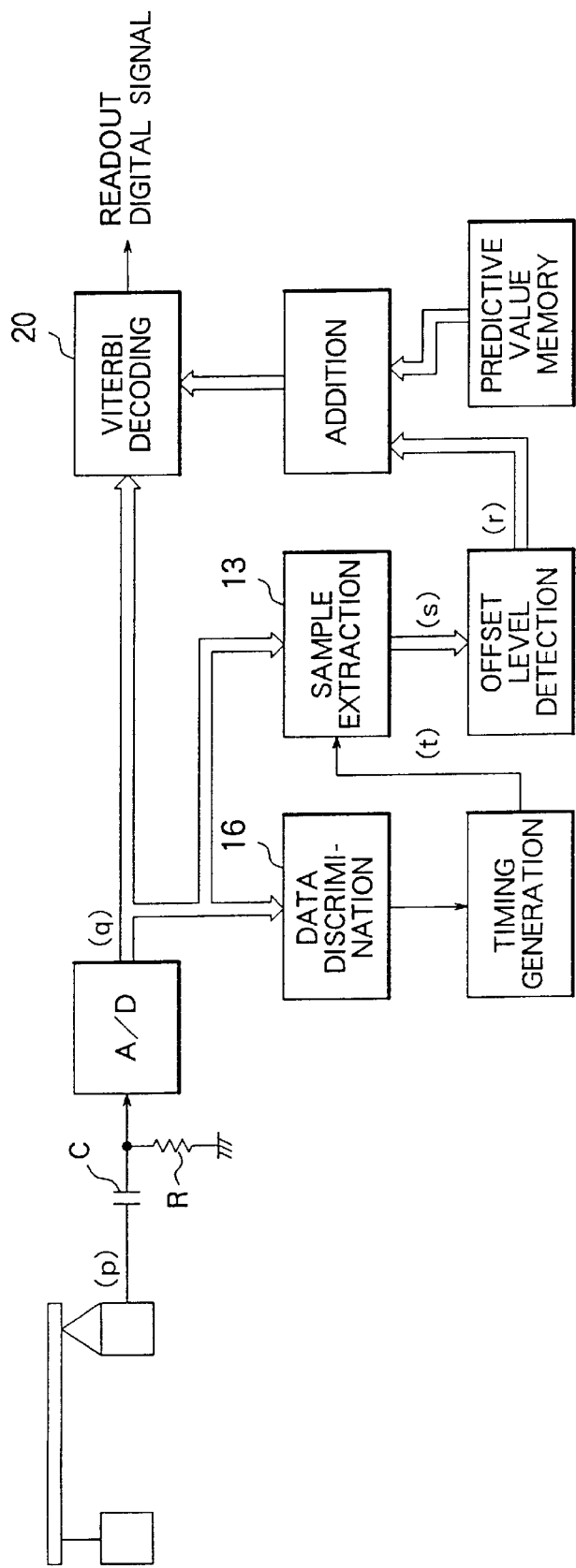
FIG. 3 is a block diagram showing a conventional device.
Figure 4:
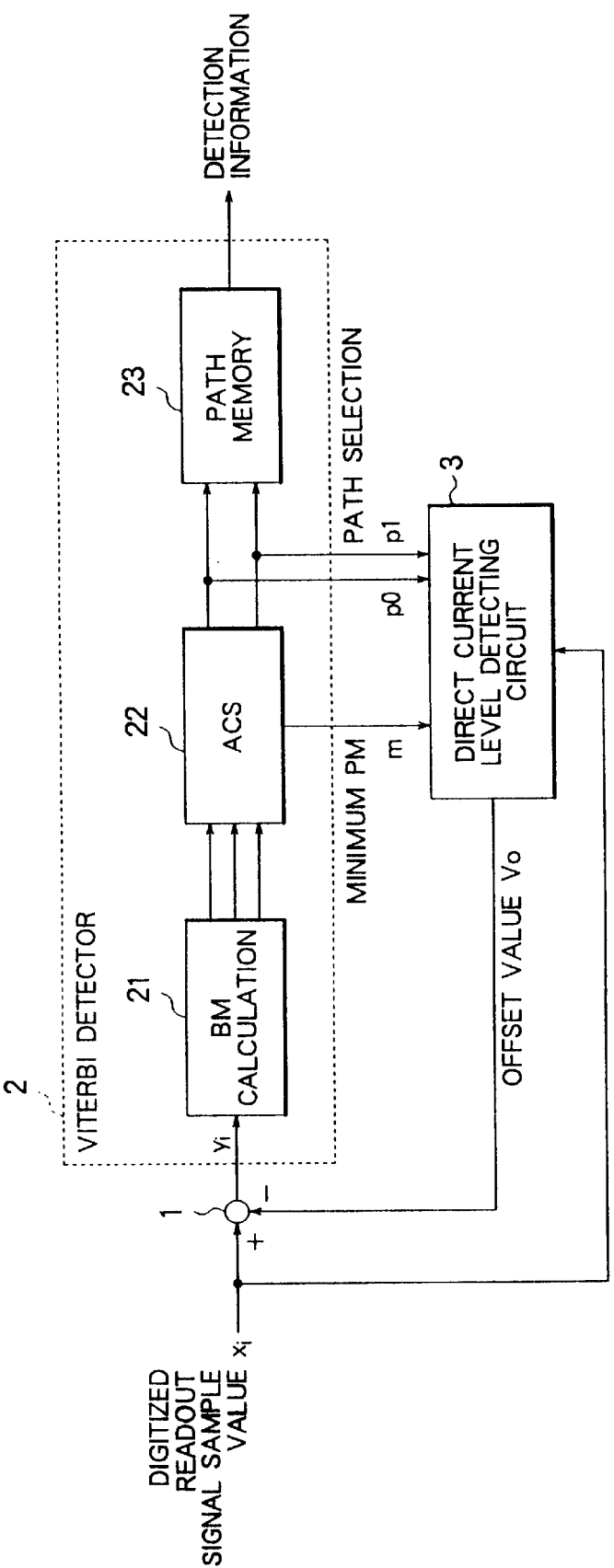
FIG. 4 is a block diagram showing a first embodiment of the present invention.

Referring to FIG. 4, a regenerative signal read out from a disk device is read in as a sample value $x_i$ by an A/D converter (not shown) and having a synchronous clock timing generated by a PLL circuit (not shown) after being corrected to have special channel characteristics by a band restricting filter (not shown) and an equalizer.

In the case where a digital equalizer is used, the resulting configuration is such that the equalizer is connected after A/D conversion. An $x_1$ is corrected by use of a direct current level detected by a direct current level detector 3 to be described later. Amplitude information $y_i$ in which a direct current level is corrected is input to a Viterbi detector 2, a branch metric is calculated by a branch metric calculating circuit 21 and a renewal of a path metric value is conducted by an Add-Compare-Select ("ACS") circuit 22 at each time point. Path selection information is stored in a path memory 23 and output as detection information, after the paths are merged.

Figure 5:
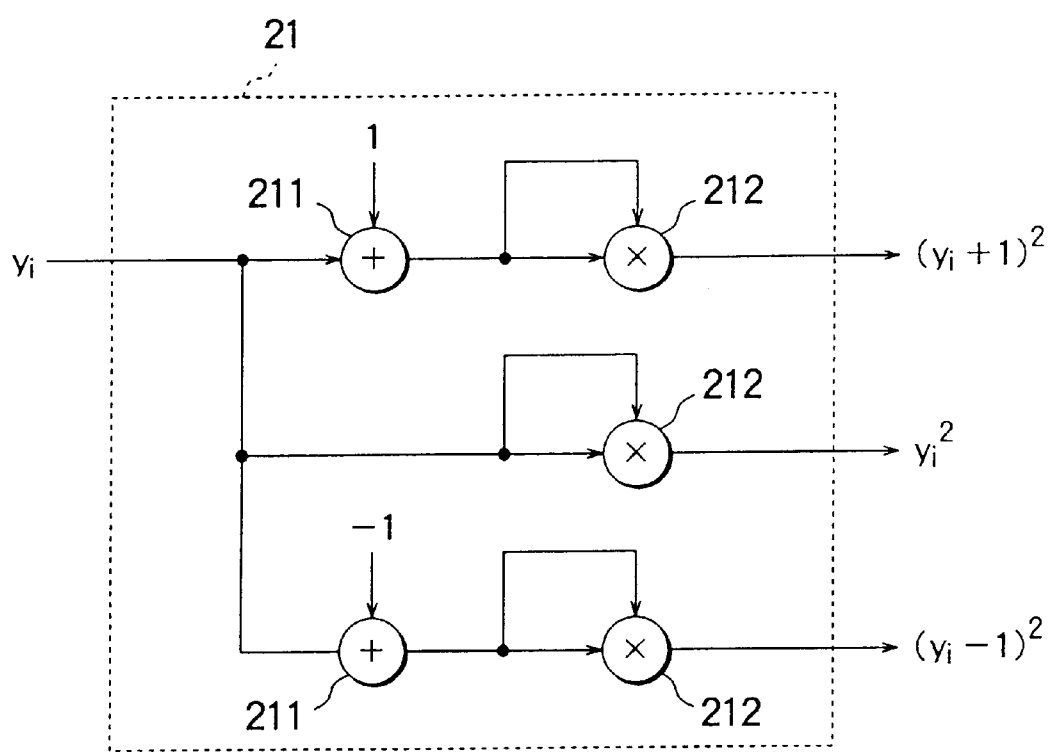
FIG. 5 is a circuit diagram of a branch metric calculating circuit in the first embodiment of the present invention.
Figure 6:
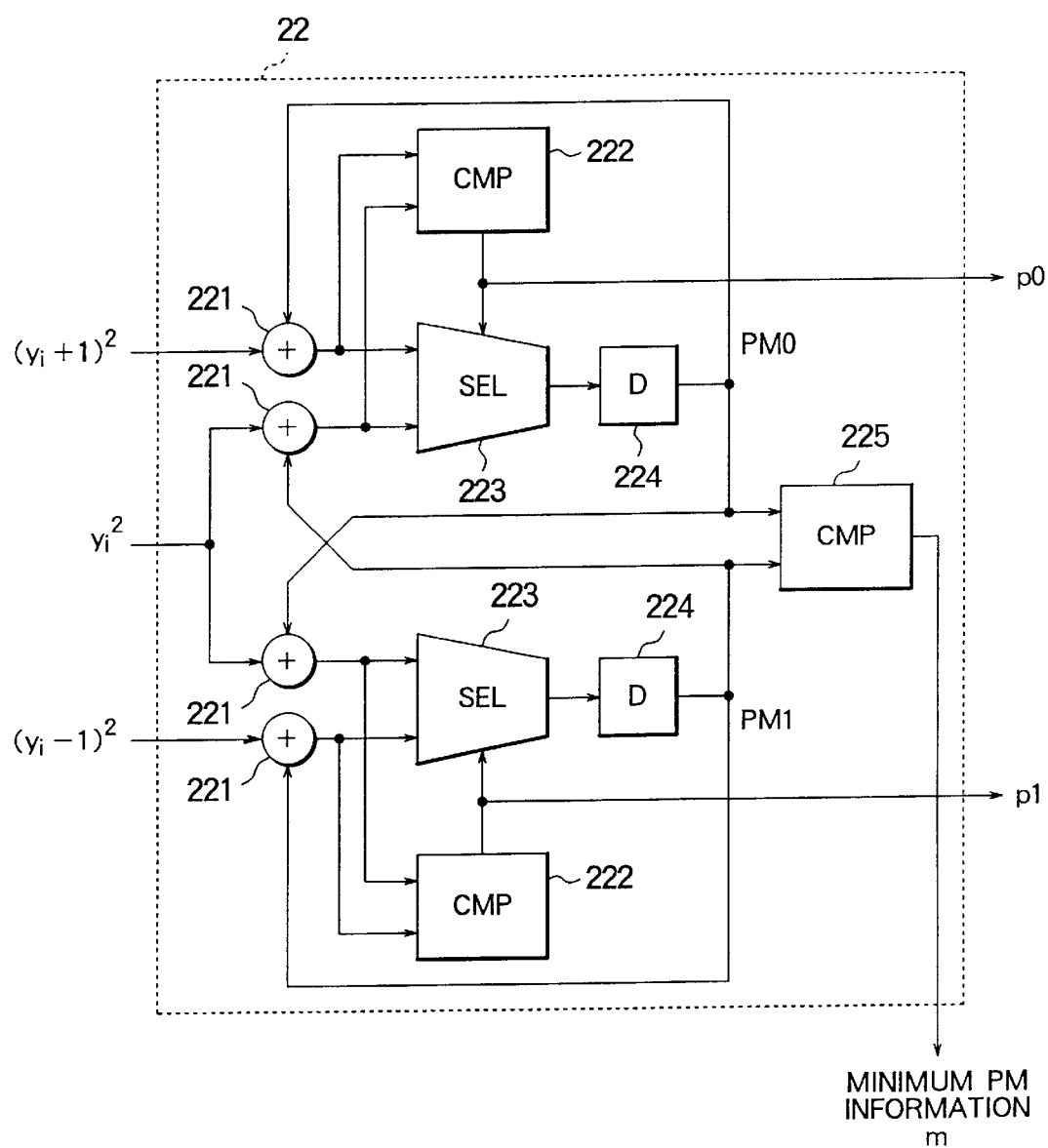
FIG. 6 is a block diagram of an ASC circuit in the first embodiment of the present invention.
Figure 7:
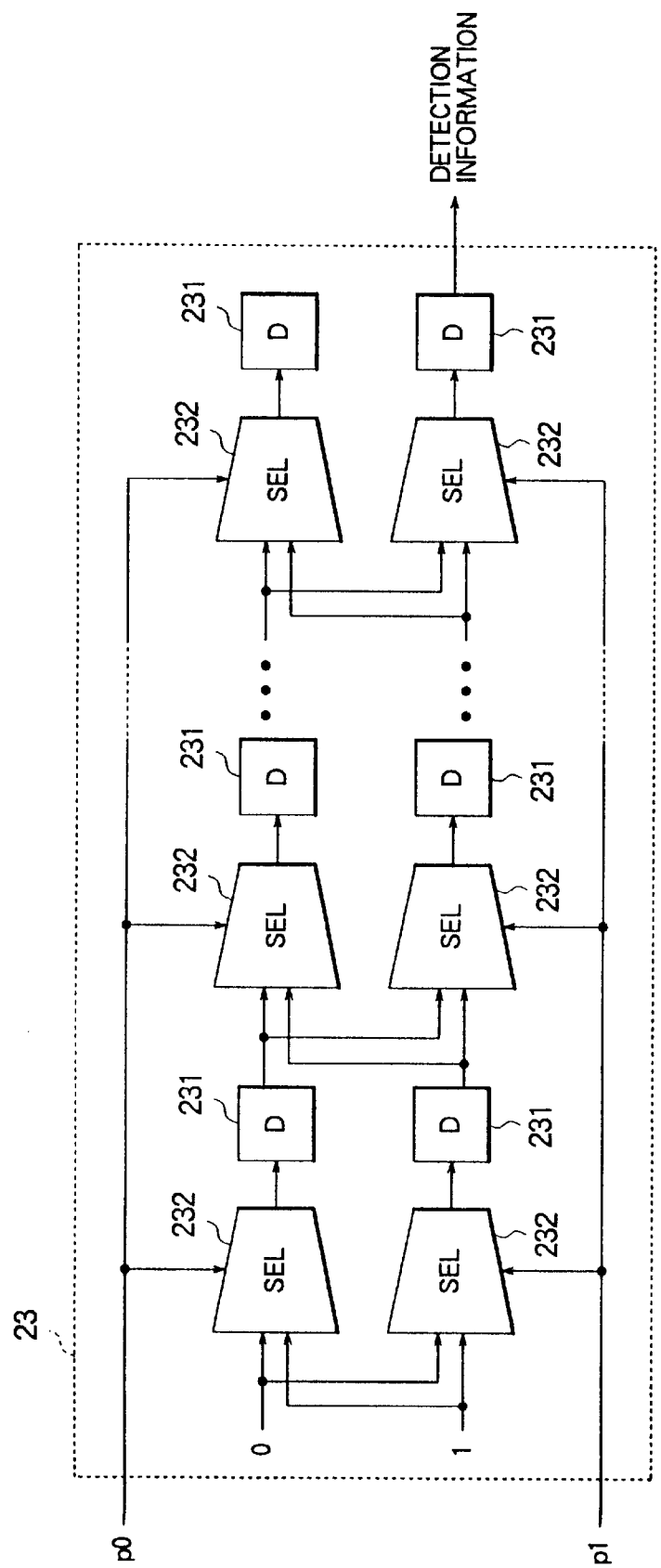
FIG. 7 is a block diagram of a path memory circuit in the first embodiment of the present invention.
Figure 23:
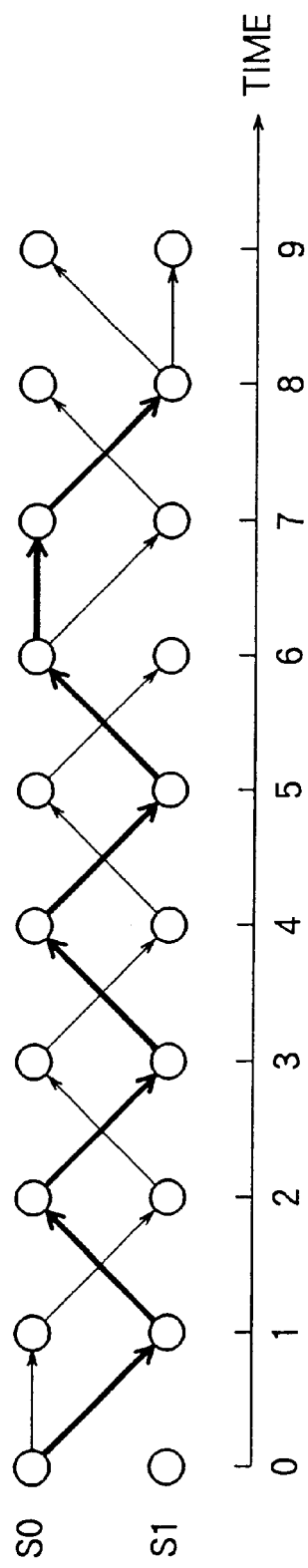
FIG. 23 is a Trellis diagram in the case where Viterbi detection is conducted in the PR (1, 1) channel.

A detailed constitution of the Viterbi detector will now be described. For this description, as an example, Viterbi detection in a PR (1, 1) channel of an optical disk which shows a state transition is shown in FIG. 23. FIG. 5 is a block diagram showing an example of the configuration of a branch metric calculating circuit 21 in the first embodiment of the present invention. The PR (1, 1) channel calculates three branch metric values for $(y_i \pm 1)^2$, $y_i^2$ using an adder 211 and multiplier 212 from input values $y_i$, since the PR (1, 1) channel is distributed around three reference values. FIG. 6 is a block diagram showing an example configuration of an ACS circuit 22 in the first embodiment of the present invention. Three branch metric values and a path metric value earlier by one time point are added together in an adder 221 and path metric values of respective paths are compared with each other in a comparator 222 as shown with the formula (2). The smaller value is selected by a selector 223 and is stored in a register 224 as a current path metric value. An output of the comparator is output as selection information p0, p1. Path metric values stored in two registers 224 are compared with each other by the comparator 225 and the comparative information is output as minimum path metric information m. FIG. 7 is a block diagram showing an example configuration of a path memory circuit 23 in the first embodiment of the present invention. Path information p0, p1 from the ACS circuit is connected to a selector 232 and a value stored in a register 231 connected to selector 232 is selected and transmitted to a back portion of path memory circuit 23. A first part in the path memory is given codes of 0 and 1 corresponding to an output value of each path in the transition diagram. If a length of a path memory is large enough, detected states in respective states are merged at a time point and the same information is output in the last part.

Figure 8:
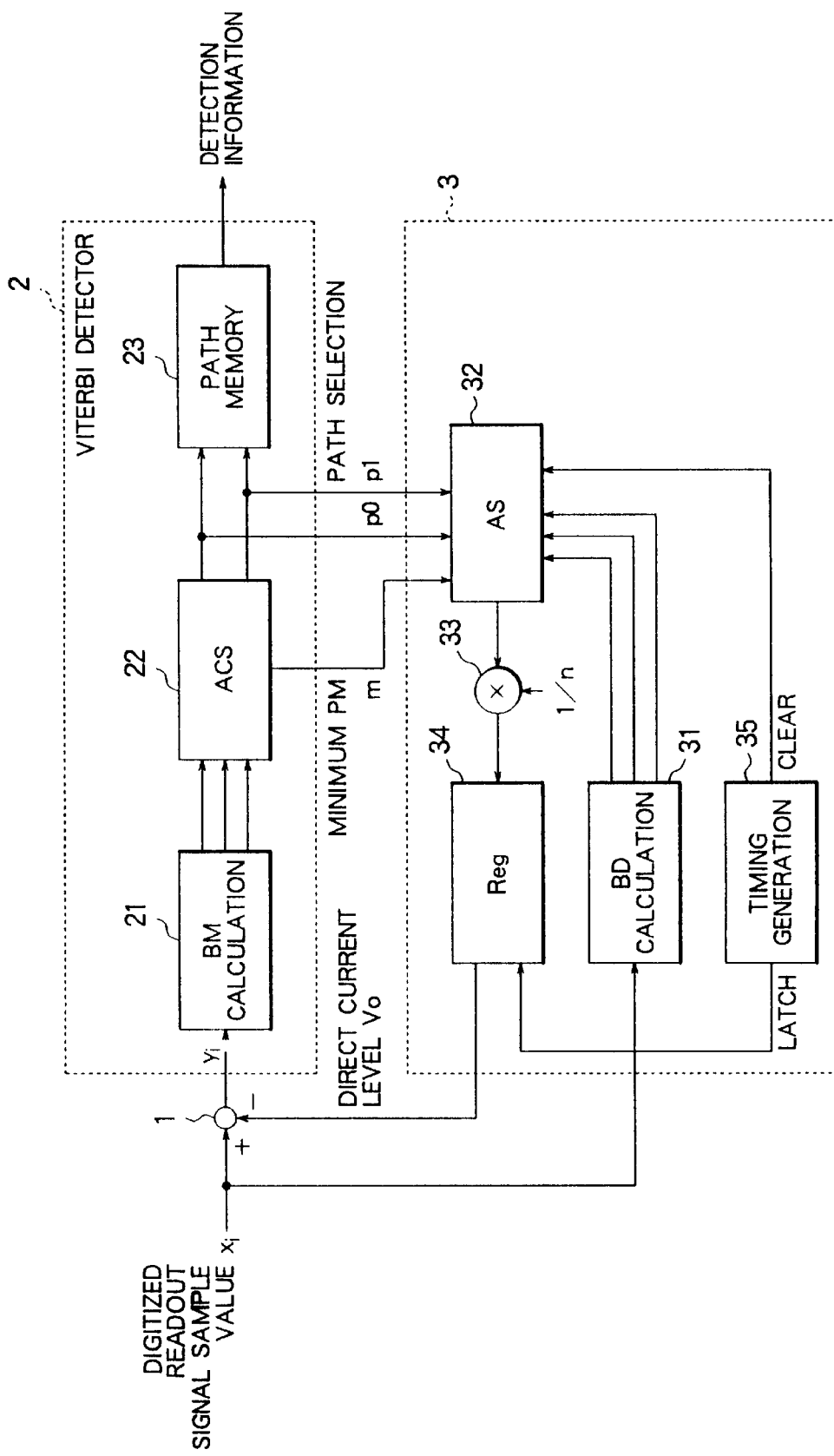
FIG. 8 is a block diagram showing a second embodiment of the present invention.

Next, a detailed description will be given for a second embodiment of the present invention with reference to the accompanying drawings. FIG. 8 is a block diagram showing an example of a direct current level detecting circuit according to the second embodiment of the present invention.

A branch difference calculation circuit 31 detects a difference value between an input value and an ideal detection level from a readout signal sample value $x_i$ and the difference value is connected to an Add-Select ("AS") circuit 32. The AS circuit 32 selectively sums branch difference values corresponding to path selection information using path selection information p0, p1 and minimum path metric information m from the Viterbi detector and in succession calculates a path difference value for n sample terms. The value is multiplied by 1/n in a multiplier 33 and the result is stored in a register 34. A timing generating circuit 35 conducts a calculation of path differences in an interval of n channel clocks and generates a latch signal immediately afterwards, and then stores the signal in the register 34. The value is output as a direct current value $V_0$. Accordingly, a direct current level is renewed every n channel clocks.

Figure 9:
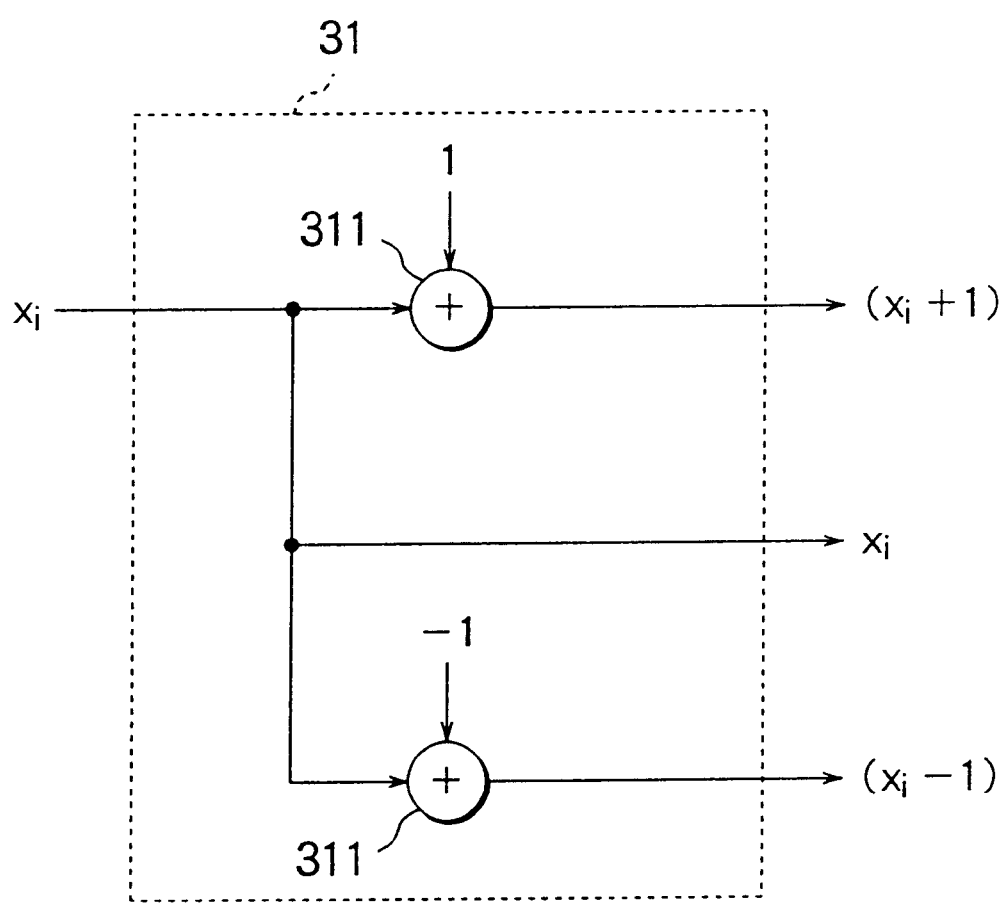
FIG. 9 is a circuit diagram of a branch difference calculus circuit in the second embodiment of the present invention.
Figure 10:
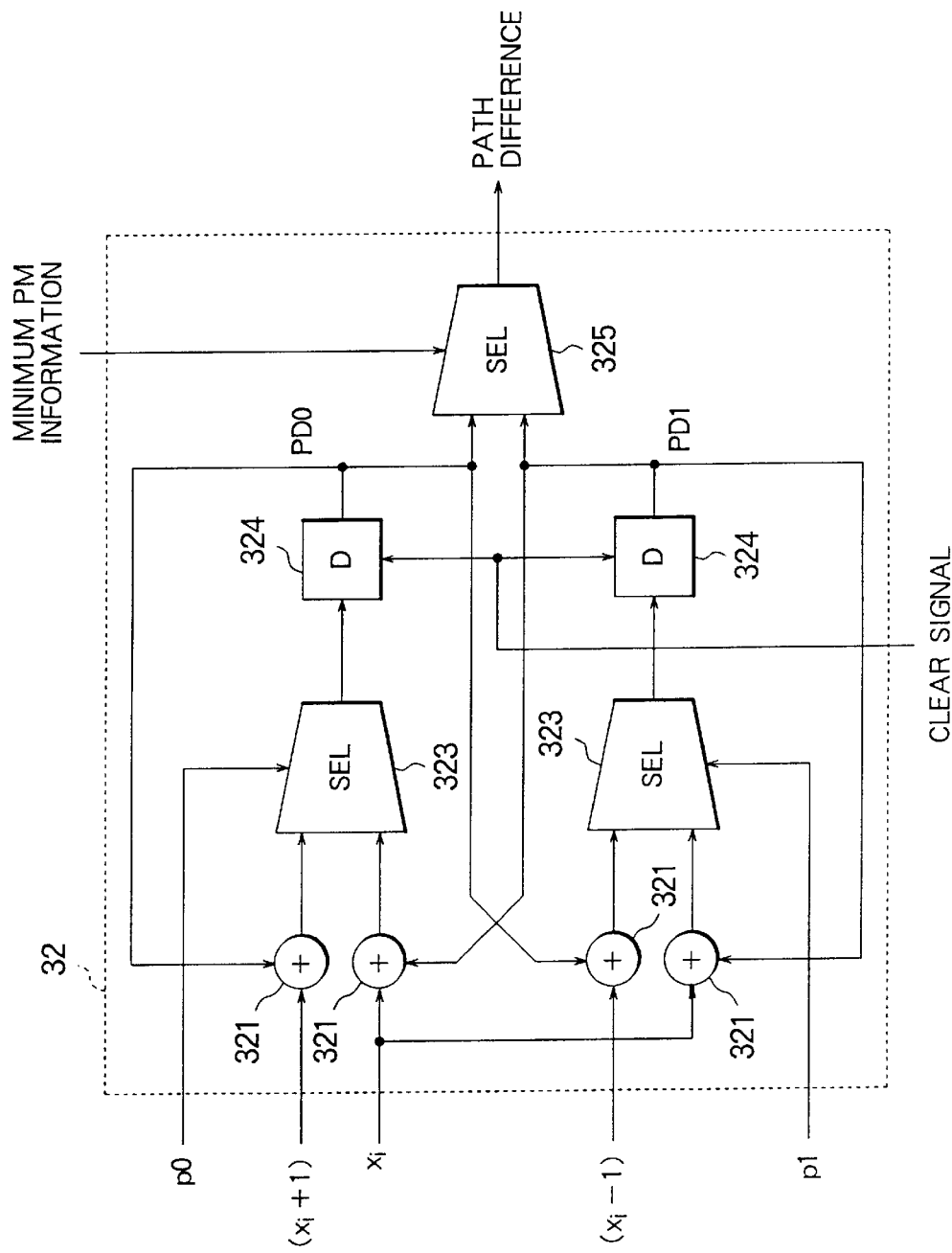
FIG. 10 is a block diagram of an AS circuit in the second embodiment of the present invention.

FIG. 9 is a block diagram showing an example of a branch difference circuit 31 according to the second embodiment of the present invention. $x_i \pm 1$ is calculated from an input $x_i$ using an adder 311 and three values including the input $x_i$ are output. FIG. 10 is a block diagram showing an example of an ACS circuit 32 according to the second embodiment of the present invention. In the ACS circuit, a branch difference value and a path difference value earlier by one time point are summed by an adder 321, the most likely path difference value is selected by a selector 323 using path selection information p0, p1 obtained from the Viterbi detector and a renewed result is stored in a register 324. One of two outputs of the register 324 is selectively output by a selector 325 using minimum path metric information.

Figure 18:
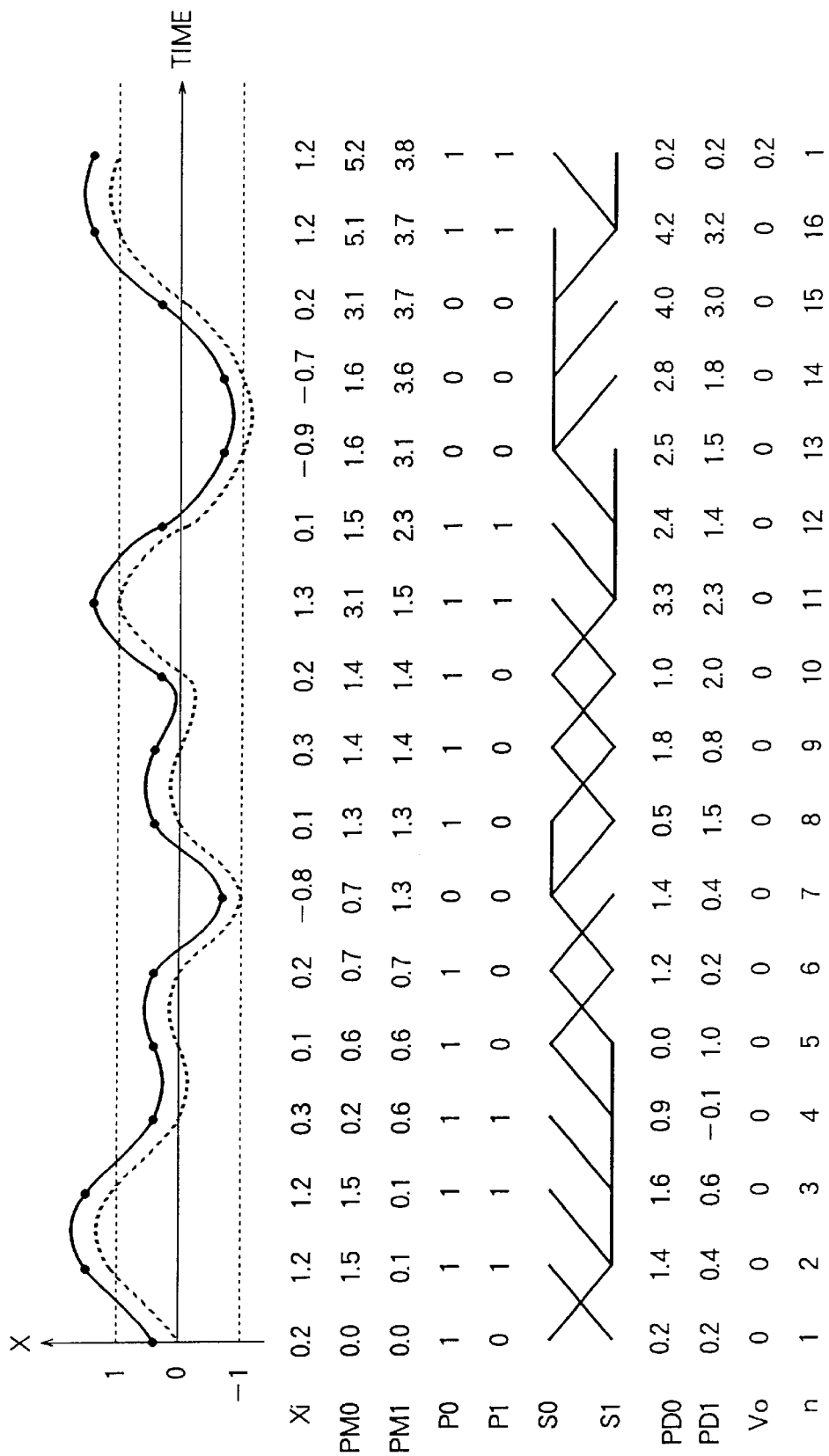
FIG. 18 is a graph showing an operation of a time series in the second embodiment of the present invention.
Figure 19:
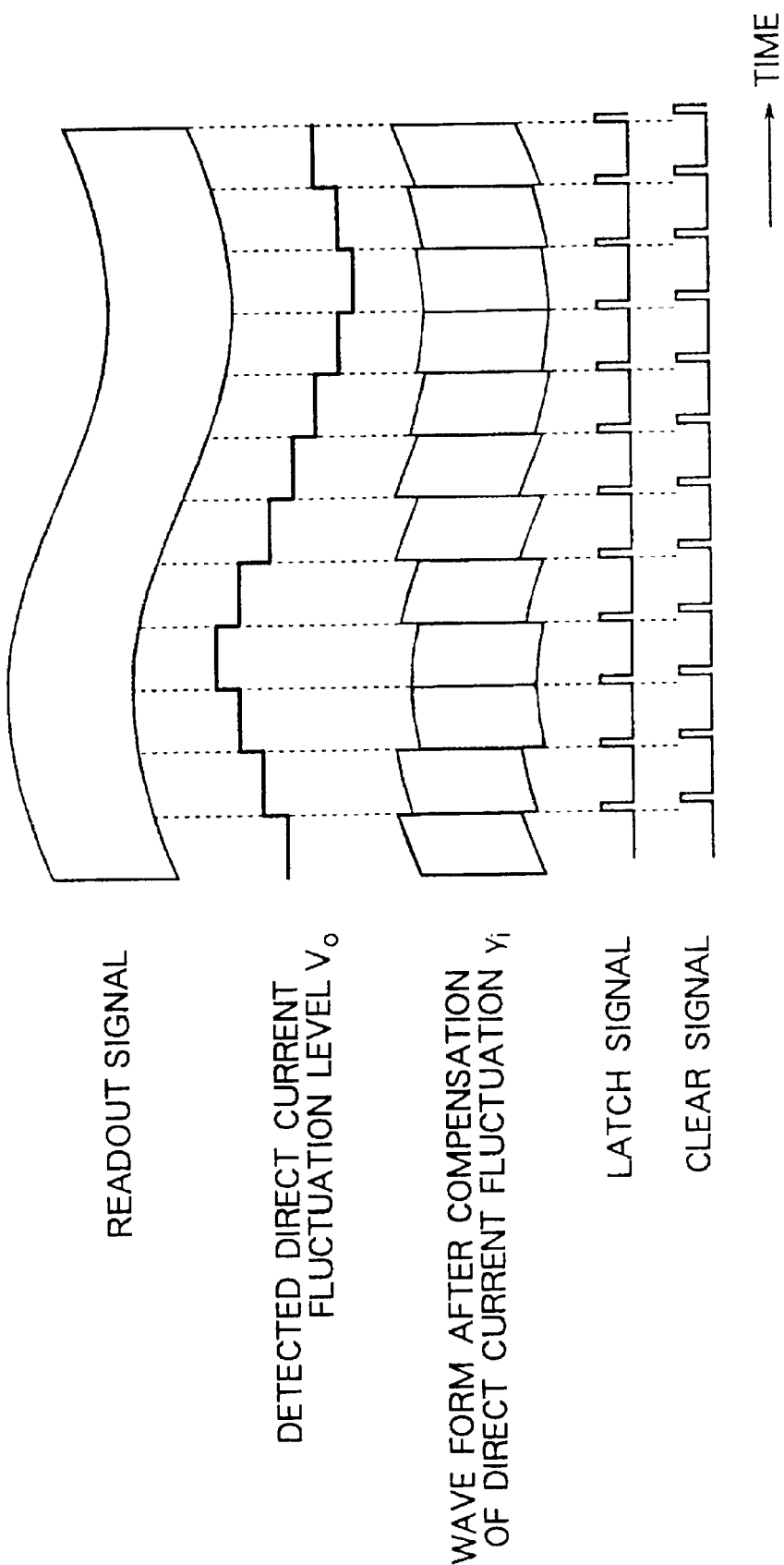
FIG. 19 is a graph showing an operation of a time series in the second embodiment of the present invention.
Figure 20:
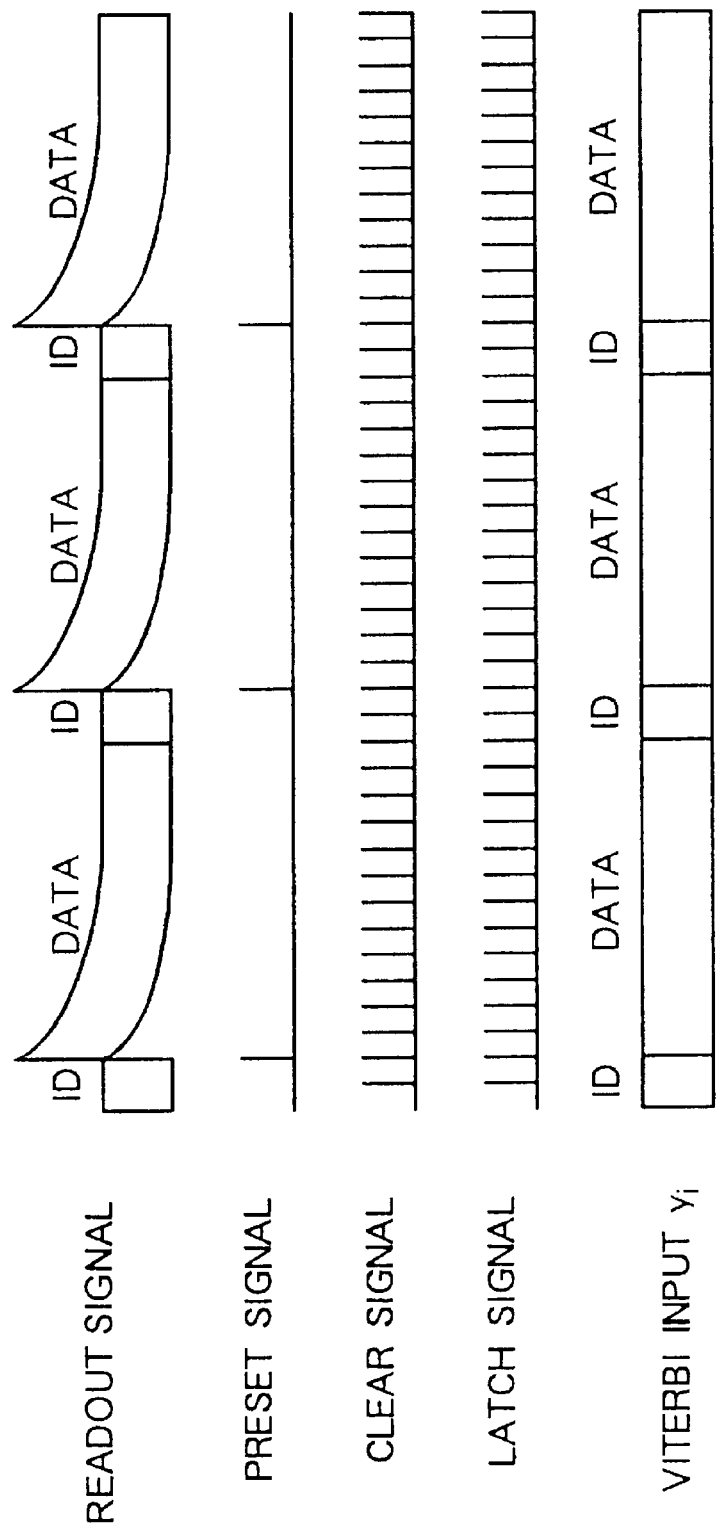
FIG. 20 is a diagram showing an operation of a time series in the third embodiment of the present invention.
Figure 21:
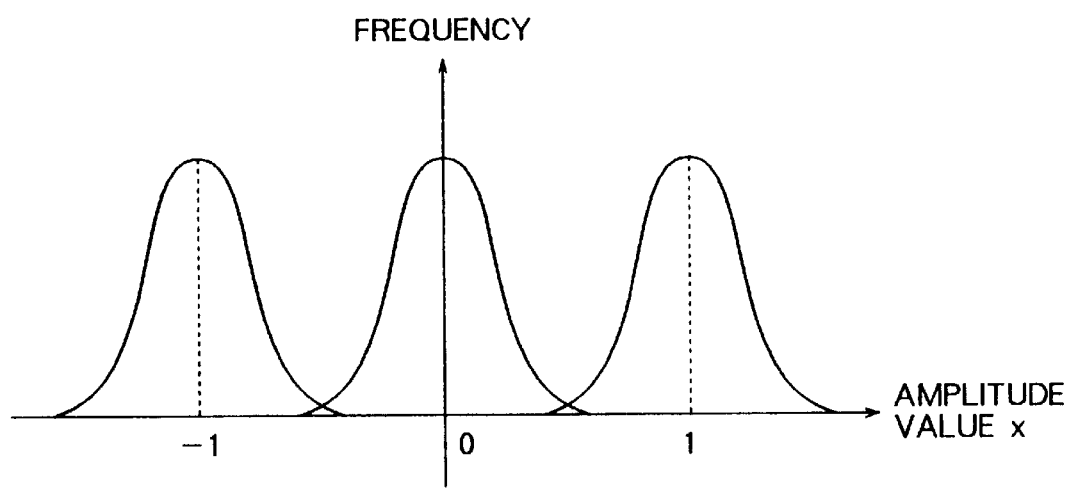
FIG. 21 is a graph showing a frequency distribution of sample values in a PR (1, 1) channel.
Figure 22:
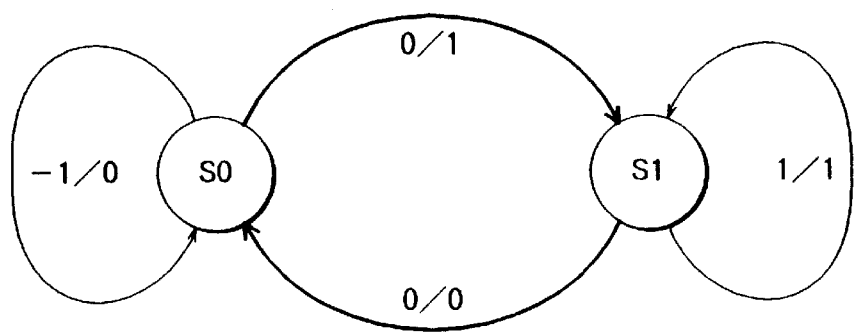
FIG. 22 is a state transition diagram for the PR (1, 1) channel.

An operation of the second embodiment of the present invention will be described in detail with reference to FIG. 18. In FIG. 18, time series values for a sample value $x_i$ are shown in the case where a readout signal having a direct current offset level of +0.2 is input, two path metric values PM0, PM1, path selection information p0, p1, path differences PD0, PD1 and an offset value $V_0$. A solid line indicates an actual readout signal and a dotted line indicates an ideal readout signal. In this example, an offset value is taken every 16 samples, whereby the path difference value is 3.2 after 16 channel clocks passes and 0.2 is obtained as detected by dividing the path difference value by 16. At this time point, the value is stored in a register and a similar operation is repeated many times, while the register, in which the path difference value is stored, is cleared to zero. In FIG. 19, the wave form of FIG. 18 is schematically shown in an enlarged manner with respect to a time axis and a readout signal is also shown on which noise in the shape of a sine curve having a sufficiently lower amplitude than a channel clock is overlapped. FIG. 19 also shows a detected direct current fluctuation level $V_0$, an input to the Viterbi detector $y_i$, a latch signal and a clear signal of a timing generating circuit. As shown, it has been found in the present invention that fluctuation can be macroscopically absorbed by direct current compensation.

Figure 11:
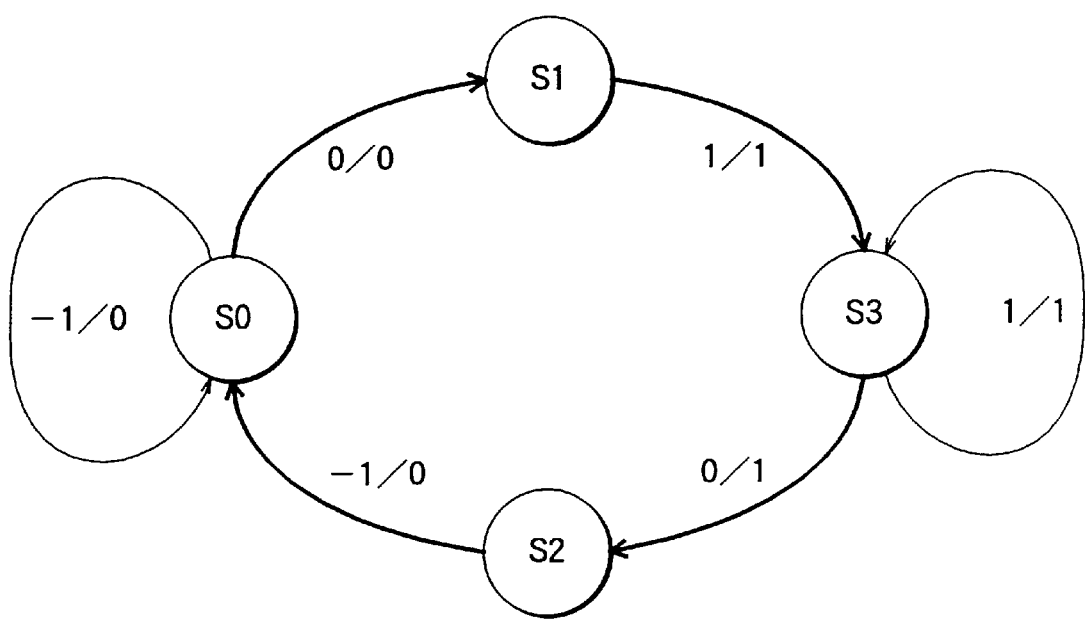
FIG. 11 is a three-value, four-state transition diagram in the case where d=1 restrictive code is subjected to a PR (1, 1) equalization.
Figure 12:
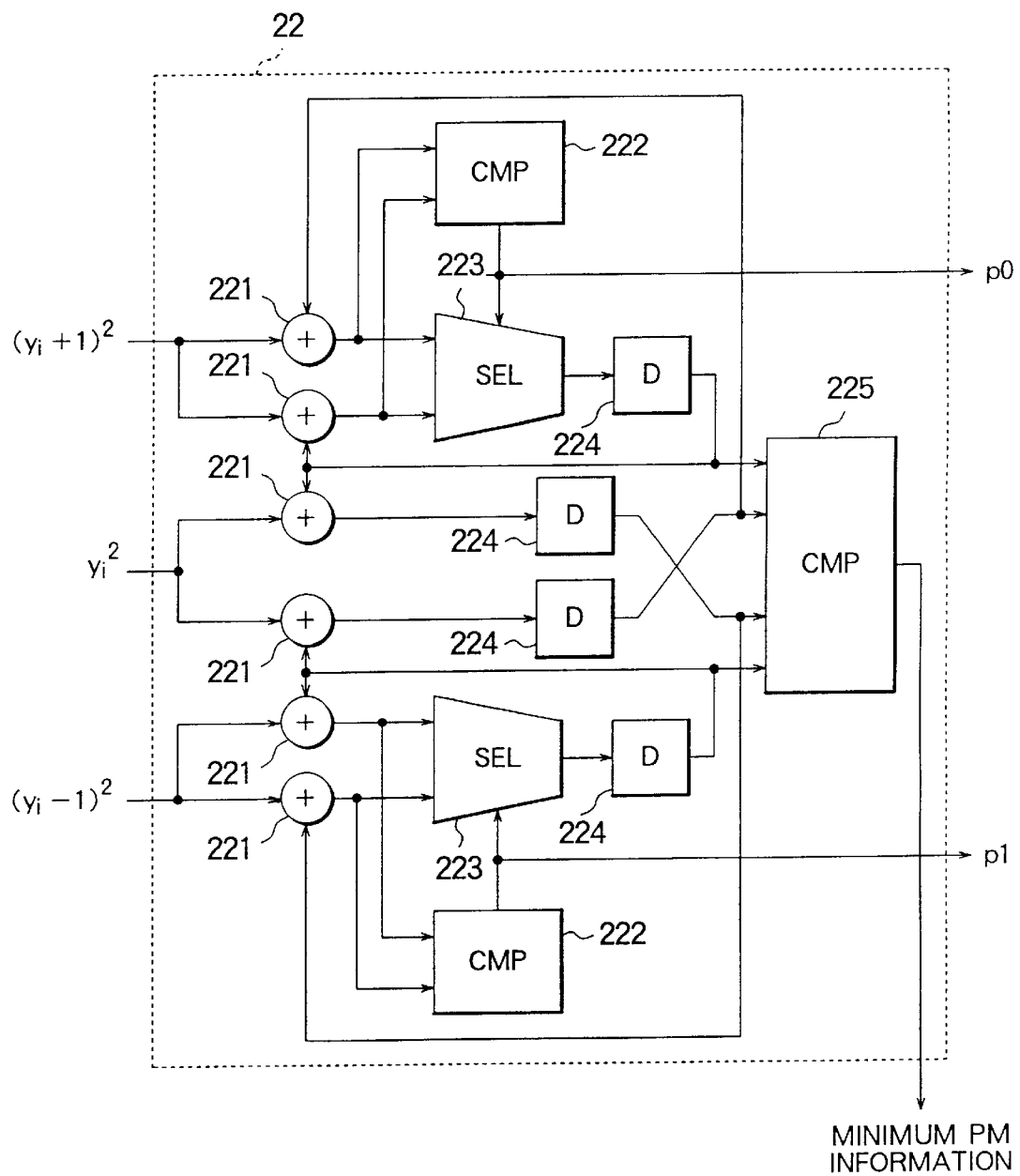
FIG. 12 is a block diagram of an ACS circuit in the second embodiment of the present invention.
Figure 13:
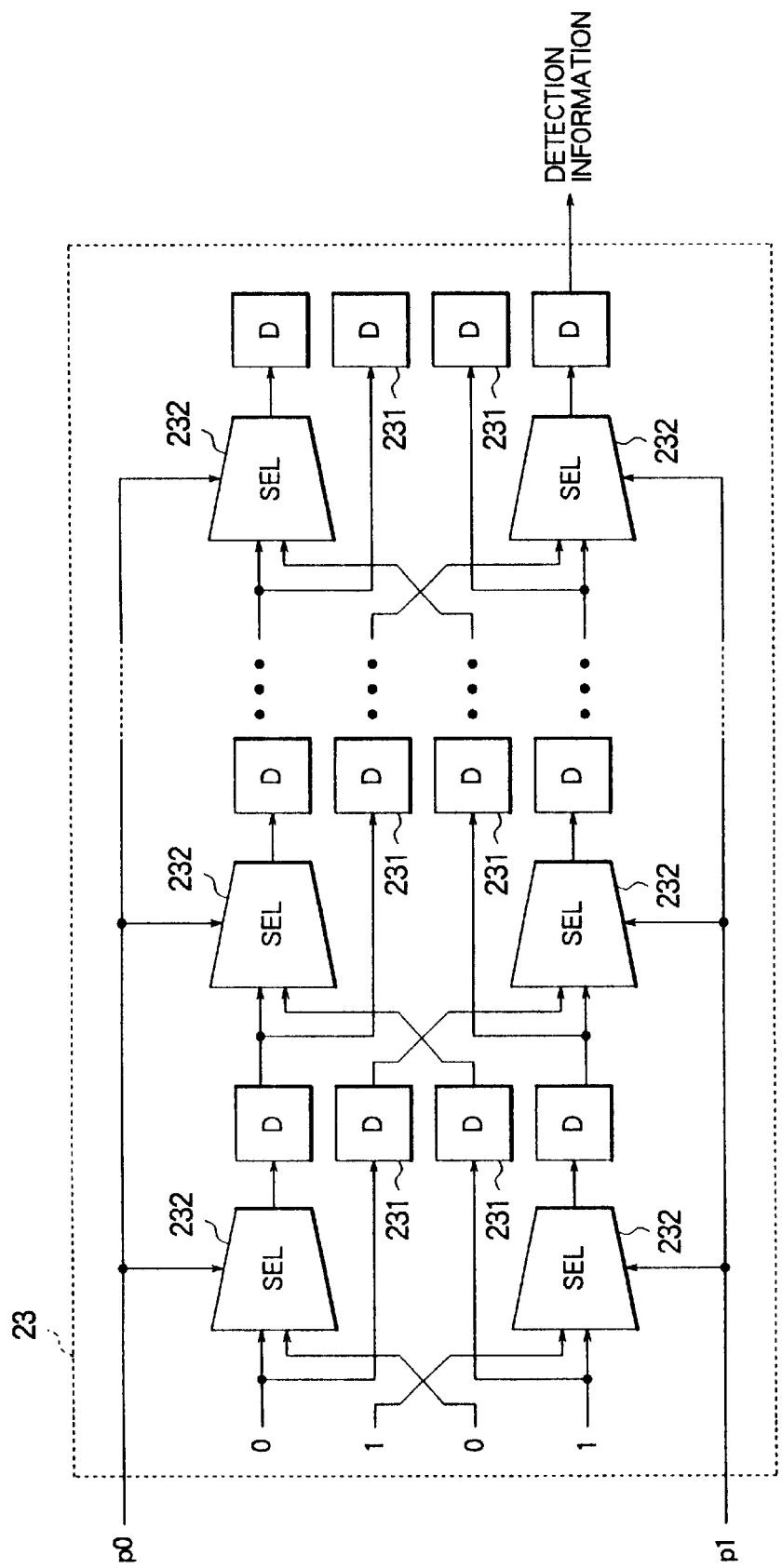
FIG. 13 is a block diagram of a path memory circuit in the second embodiment of the present invention.
Figure 14:
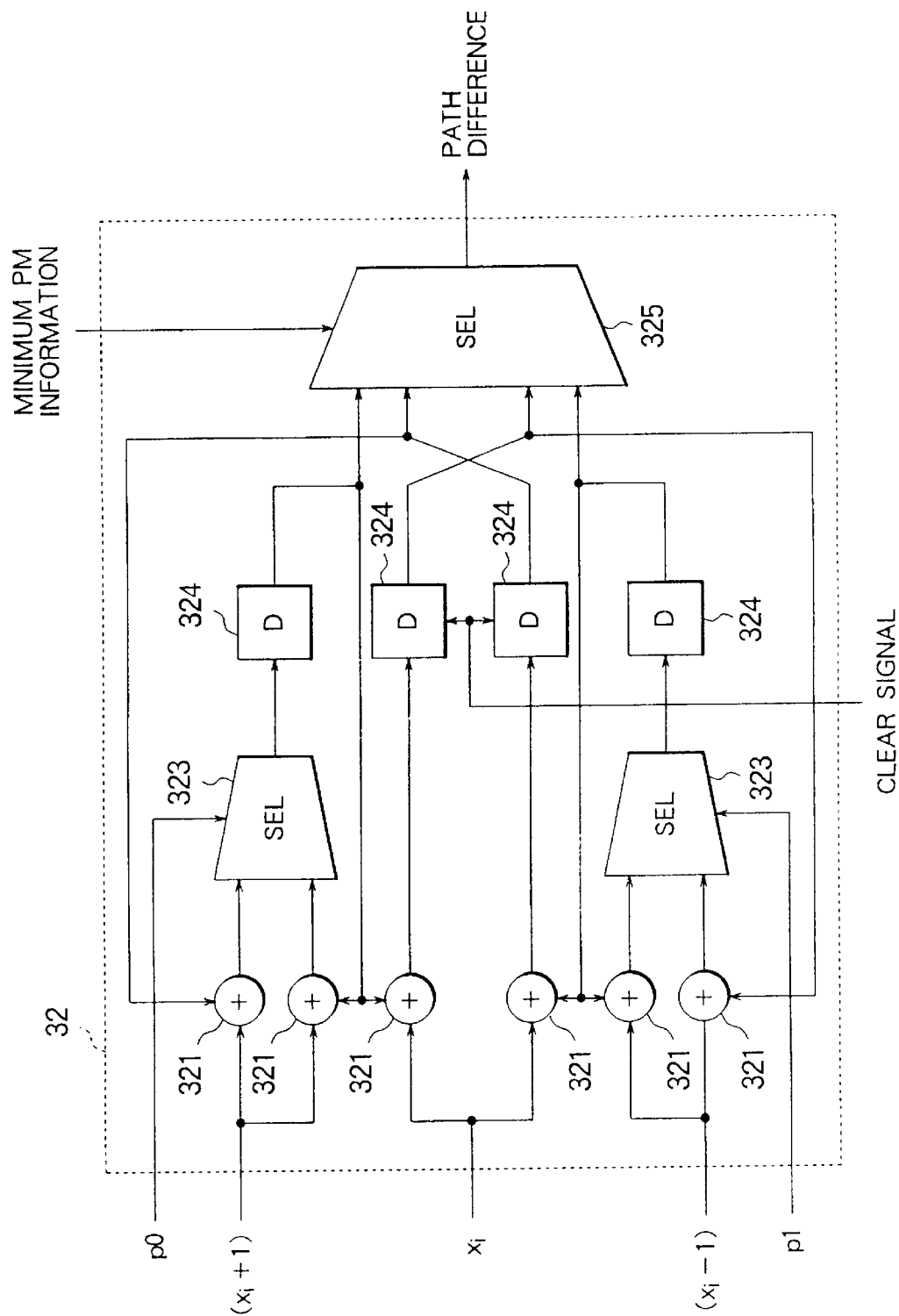
FIG. 14 is a block diagram of an AS circuit in the second embodiment of the present invention.

The second embodiment of the present invention can be constructed in any manner, as long as there is a channel which can be constructed with a Viterbi detector. For example, if a (1, 7) PLL code is subjected to NRZI recording and a PR (1, 1) equalization in an optical disk, a three-value, four-state transition occurs as shown in FIG. 11. An example of circuit constitution in this case will be described. FIG. 12 is an example of an ACS circuit in an three-value, four state channel. Three branch metrics and a path metric value at a time point earlier by one time point are summed at adder 221 and path metric values of respective paths are compared in a comparator 222, the smallest value is selected in a selector 223 and stored in a register 224 as a current path metric value. Outputs of the comparator are output as path selection information p0, p1. Path metric values respectively stored in four registers 224 are compared by the comparator 225 to output a minimum path metric information. FIG. 13 is an example of a path memory circuit in a three-value, four-state channel. In the figure, path selection states p0, p1 from the ACS circuit are connected to a selector 232, and a value stored in a register 231 connected to selector 232 is selected and transmitted to a back portion of the path memory circuit. Codes of 0 and 1 corresponding to output values of respective paths of the state transition diagram are given to a first part of the path memory. If a length of a path memory is large enough, detection information in each state is merged at a time point and the same information is output at the last part. FIG. 14 is an example of an AS circuit in a three-value, four state channel. A branch difference value 1 and a path difference value at a time point earlier by one time point are summed up by an adder 321, the most likely path difference value is selected by a selector 323 using path selection information p0, p1 obtained from a Viterbi detector, and a renewed result is stored in a register 324. Outputs of four registers 324 are selected and output by a selector 325 using minimum path metric information.

Figure 15:
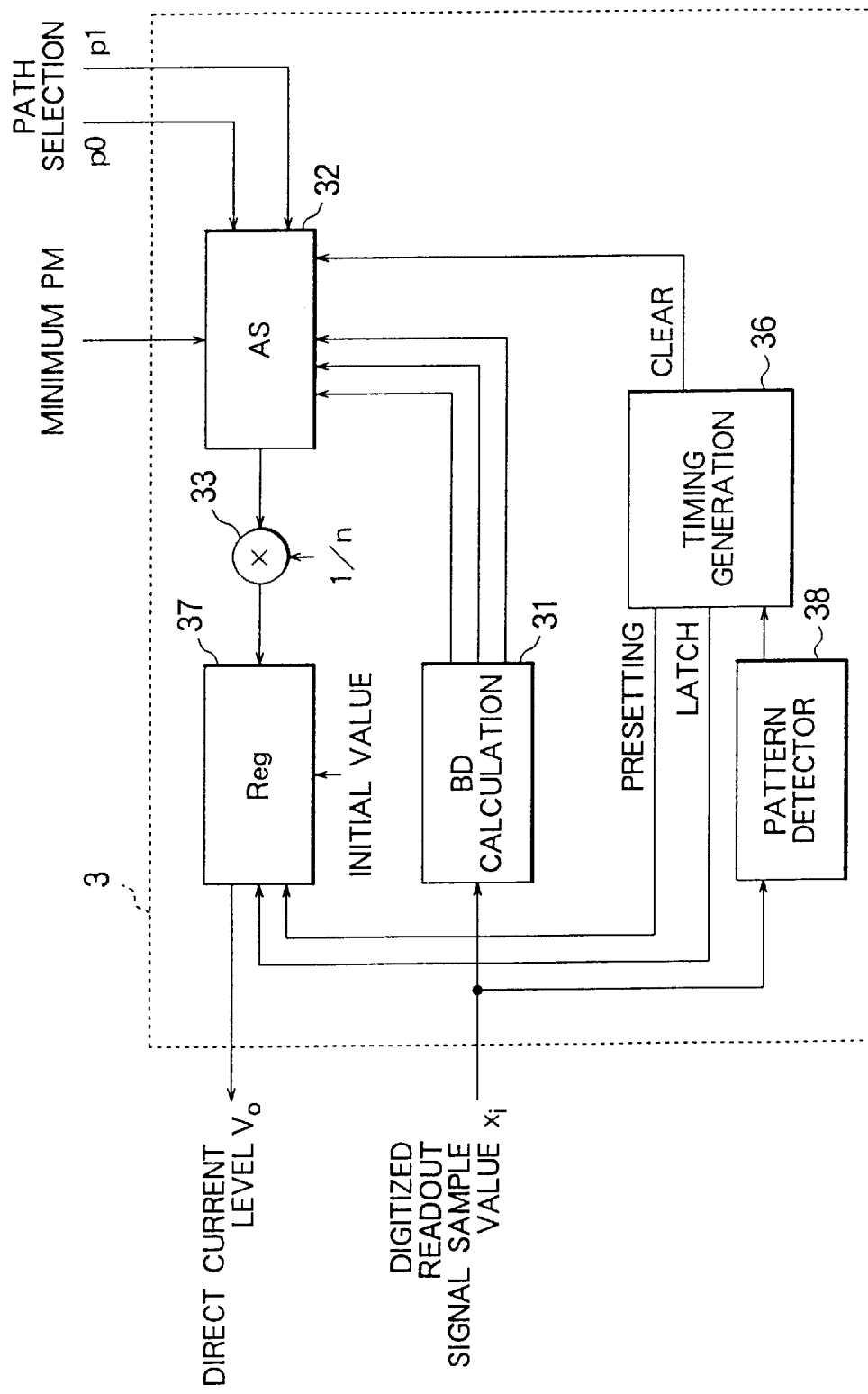
FIG. 15 is a block diagram showing a third embodiment of the present invention.

A third embodiment of the present invention will be described in detail with reference to FIG. 15. In the case where the position and level of a direct current level fluctuation are known, conversion is faster when an offset value is preset. The structure of this embodiment comprises: a pattern detector 38 for detecting a specified pattern among information of a readout signal sample $x_i$; a register 37 in which an initial value is preset; and a timing generating circuit 36 for generating three signals consisting of a latch signal, a clear signal and a preset signal. During operation, a special pattern of a leading part of a sector is detected by a pattern detector 38, a timing signal is generated from the preset timing signal thereof, and an initial value is provided to a register 37. Thereafter, Viterbi detection is performed, while direct current fluctuation levels are sequentially detected according to the above mentioned process. FIG. 14 is a wave form diagram having a schematic shape illustrating the operation of the third embodiment of the present invention. A rapid change in level which is known in advance can be accommodated by presetting a direct fluctuation value just before the rapid change of $x_i$ in level.

Figure 16:
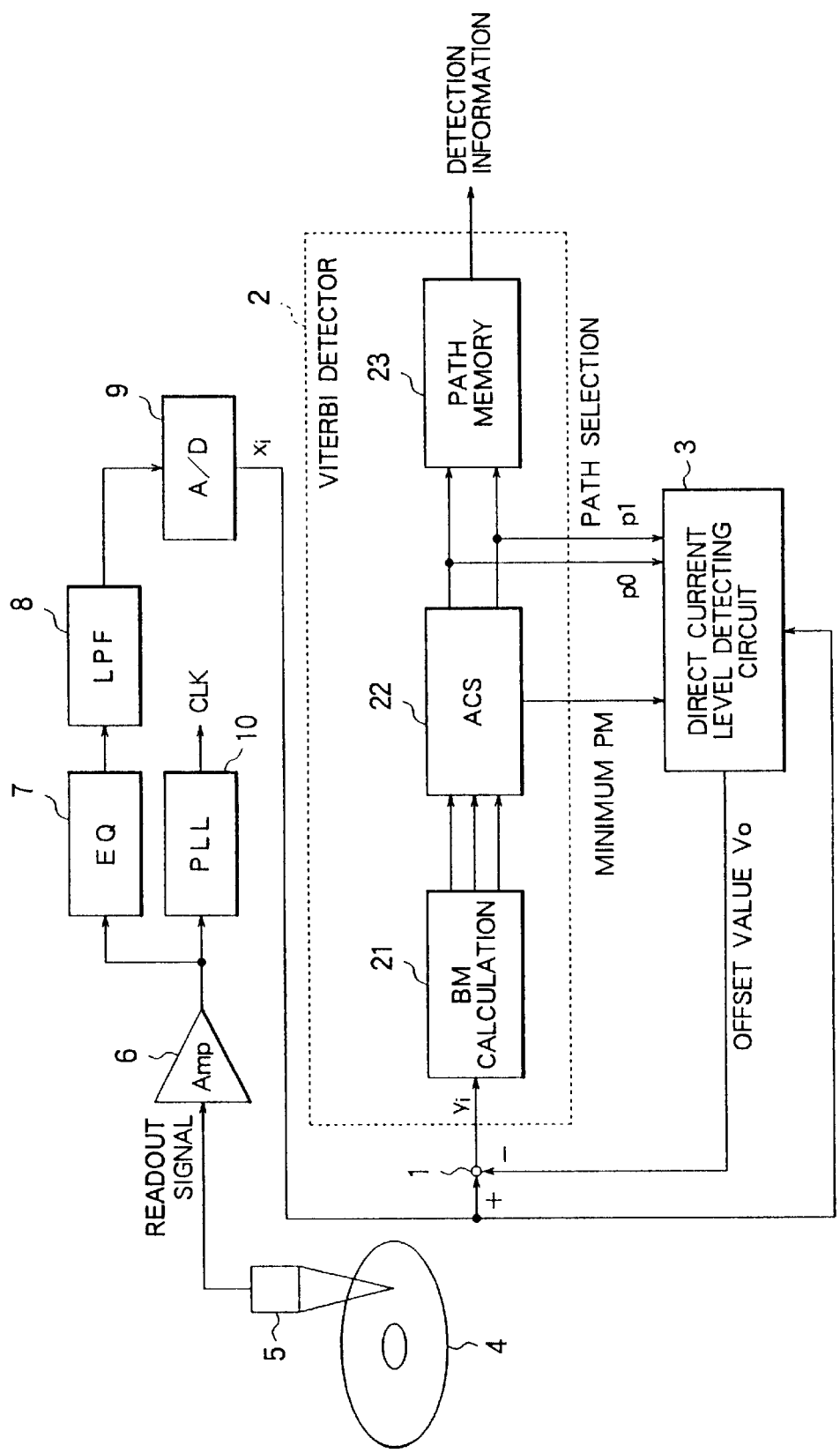
FIG. 16 is a block diagram showing a fourth embodiment of the present invention.

A detailed description of a fourth embodiment of the present invention will now be provided with reference to FIG. 16. Information recorded on an optical disk medium 4 is regenerated by an optical head 5 for detecting an amount of reflected or polarized light under exposure to collimated laser light. The optical head is controlled for tracing in directions of a focus and track with accuracy using a servo circuit (not shown). A readout signal read-out by the optical head 5 is amplified by an amplifier 6 and corrected by an equalizer 7 so as to be suitable for a channel predetermined by a Viterbi detector installed downstream. After the readout signal further passes an anti-aliasing filter 8 and is subjected to A/D conversion, it is transformed into a digital signal $x_i$. In a digital system, a clock signal is generated from the readout signal by a PPL circuit 10. $X_i$ is compensated with respect to a direct current fluctuation by subtracting an offset value which is output from a direct current detecting circuit before it is input to the Viterbi detector 2 and thereafter, the compensated $x_i$ value is input to the Viterbi detector 2 to conduct the most likelihood detection. A direct current level detecting circuit calculates a direct current in an adaptive manner using path selection information and minimum path information obtained from the Viterbi detector 2, and provides feed back, so that direct current fluctuation is compensated.

Figure 17:
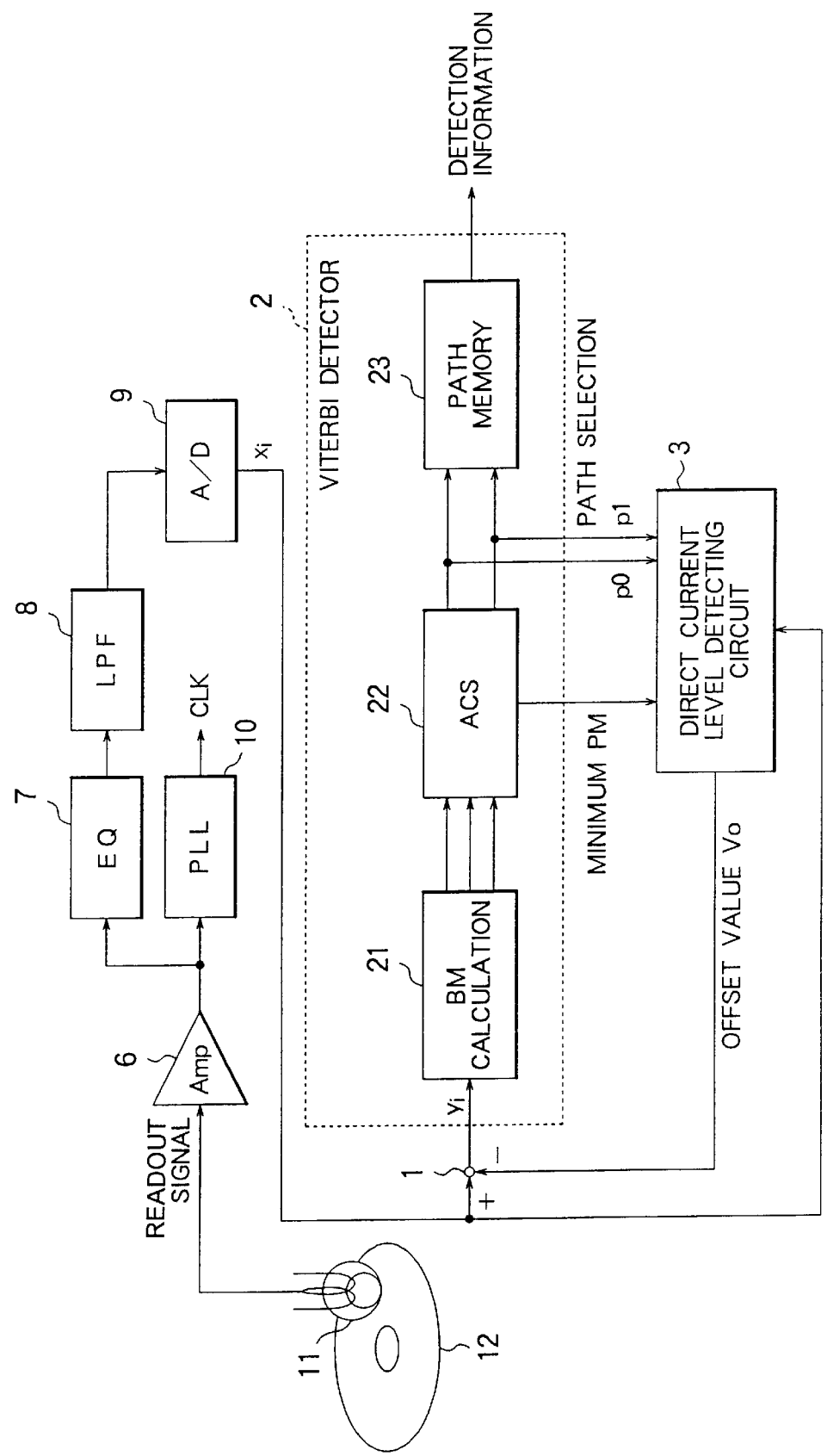
FIG. 17 is a block diagram showing a fifth embodiment of the present invention.

Detailed description will now be provided for a fifth embodiment of the present invention with reference to FIG. 17. Information recorded on a magnetic disk medium 12 is detected as a current value by a magnetic head in extremely close relation with the surface of the medium. The magnetic head is controlled for tracing in a track direction with accuracy by a servo circuit. A readout signal read by the magnetic head 11 is amplified by an amplifier 6 and corrected by an equalizer 7 so as to be in conformity with a channel predetermined by a Viterbi detector downstream. After the readout signal further passes an anti-aliasing filter 8 and is subjected to A/D conversion, a digital signal is generated. A clock in a digital system is generated from the readout signal by a PLL circuit 10 in advance. $X_i$ is compensated with respect to a direct current fluctuation by subtracting an offset value, which is output from a direct current level detecting circuit, before it is input to the Viterbi detector. Thereafter, the compensated $x_i$ is input into the Viterbi detector 2 to conduct the most likelihood detection. A direct current level detecting circuit calculates the direct current level in an adaptive manner using path selection information obtained from the Viterbi detector 2 and provides feed back, so that direct current fluctuation is compensated.

A first effect of the present invention is that the inventive system is applicable to any regenerative channel. The reason for this is that an AS circuit having almost the same structure as an ACS circuit in a Viterbi detector can be formed, and thereby compensation of a direct current level according to the present invention can be achieved in any channel in which Viterbi detection is applicable.

A second effect of the present invention is that the inventive system can attain high detection accuracy of a direct current level value and enable performance of a Viterbi detector. The reason for this effect is that a direct current level value is generated using all the input values and thus a higher SNR than a conventional case can be secured, the conventional case having utilized only information in specific states.

A third effect of the present invention is to make it possible to realize recording/regeneration with higher efficiency. The reason for such efficiency is that a direct current level value can be generated from any input signal and thereby it is unnecessary to embed test patterns in many places as are required in conventional techniques.

A fourth effect is to enable information to be correctly detected even with a direct current fluctuation level appearing immediately after a change-over from a preformat region to a user region. The reason for this is that a direct current fluctuation level is detected from input data and thereby a time lag necessarily arises, but a change-over to a detection level and a fluctuation level given externally is enabling.

What is claimed is:

1. A device for detecting information comprising:
   a subtracter for subtracting an offset from a digitized input sample value;
   a Viterbi detector using an output of said subtracter as an input; and
   a detecting circuit for detecting direct current level from said sample value and path selection information and minimum path metric information which are detected in said Viterbi detector, wherein an output of said direct current level detecting circuit is fed back to said subtracter as an offset value, and wherein said detecting circuit for detecting the direct current level comprises:
- a branch difference calculating circuit for detecting a difference between an input sample value and a reference level;
- an AS circuit for calculating a path difference by summing branch differences of selected paths in n sample terms using path selection information and minimum path metric information from the Viterbi detector;
- a multiplier for transforming said path difference value to 1/n thereof, wherein n is an integer;
- a register for holding said multiplication result; and
- a timing generating means for generating a latch signal of the register and a clear signal for a register in said AS circuit with an n sample cycle.

2. A device for detecting information according to claim 1, wherein the input signal is a PR (1, 1) channel.

3. An optical disk device, comprising a regenerative system having a device for detecting information according to claim 1.

4. A magnetic disk device, comprising a regenerative system having a device for detecting information according to claim 1.

5. A device for detecting information comprising:
- a subtracter for subtracting an offset from a digitized input sample value;
- a Viterbi detector using an output of said subtracter as an input; and
- a detecting circuit for detecting direct current level from said sample value and path selection information and minimum path metric information which are detected in said Viterbi detector, wherein an output of said direct current level detecting circuit is fed back to said subtracter as an offset value, and wherein said detecting circuit comprises:
  - a branch difference calculating circuit for detecting a difference between an input sample value and a reference level;
  - an AS circuit for calculating a path difference by summing branch differences of selected paths in n sample terms using path selection information and minimum path metric information from the Viterbi detector;
  - a multiplier for transforming said path difference value to 1/n thereof, wherein n is an integer;
  - a register in which the multiplication result is held and an initial value can be externally set;
  - a detecting means for detecting a specified pattern from an input amplitude value signal; and
  - a timing generating means for generating a preset signal and a latch signal of the register and a clear signal of the register in said AS circuit from the specified pattern detecting signal, wherein said timing generating means generates said latch and clear signals in synchronization with the preset signals with an n sample cycle.

6. A device for detecting information according to claim 5, wherein the input signal is a PR (1, 1) channel.

7. An optical disk device, comprising a regenerative system having a device for detecting information according to claim 5.

8. A magnetic disk device, comprising a regenerative system having a device for detecting information according to claim 5.

9. A method for information detection comprising the steps of:
- subtracting a direct current level offset from a digitized input sample value;
- conducting Viterbi detection from a residue of said sample value after the subtraction;
- obtaining a branch difference between said input sample value and a reference value;
- calculating a path difference by summing said branch differences of selected paths using path selection information and minimum path metric information, which are detected in Viterbi detection, in an interval of n channel clocks;
- obtaining a direct current level offset by multiplying said path difference by 1/n, n being an integer; and
- returning to the step of subtracting a direct current level offset from a digitized input sample value.

* * * * *